(12) United States Patent
Marks et al.

(10) Patent No.: US 8,471,253 B2
(45) Date of Patent: Jun. 25, 2013

(54) CROSSLINKED HYBRID GATE DIELECTRIC MATERIALS AND ELECTRONIC DEVICES INCORPORATING SAME

(75) Inventors: Tobin J. Marks, Evanston, IL (US); Young-geun Ha, Evanston, IL (US); Antonio Facchetti, Chicago, IL (US)

(73) Assignee: Northwestern University, Evanston, IL (US)

( * ) Notice: Subject to any disclaimer, the term of this patent is extended or adjusted under 35 U.S.C. 154(b) by 30 days.

(21) Appl. No.: 13/111,545

(22) Filed: May 19, 2011

(65) Prior Publication Data

US 2011/0284849 A1    Nov. 24, 2011

Related U.S. Application Data

(60) Provisional application No. 61/346,245, filed on May 19, 2010.

(51) Int. Cl.
*H01L 29/12* (2006.01)
*H01L 51/00* (2006.01)

(52) U.S. Cl.
USPC .. 257/43; 257/40; 257/E29.003; 257/E29.273

(58) Field of Classification Search
CPC ........ H01L 29/7869; H01L 21/16; H01L 21/00
USPC ................. 257/43, 40, 57, E29.003, E29.273
See application file for complete search history.

(56) References Cited

U.S. PATENT DOCUMENTS

| | | | |
|---|---|---|---|
| 6,680,040 B1 * | 1/2004 | Nishida et al. | 423/335 |
| 7,605,394 B2 | 10/2009 | Marks et al. | |
| 8,093,588 B2 | 1/2012 | Marks et al. | |
| 8,274,075 B2 | 9/2012 | Marks et al. | |
| 2006/0202195 A1 * | 9/2006 | Marks et al. | 257/40 |
| 2007/0181961 A1 | 8/2007 | Marks et al. | |
| 2007/0284629 A1 | 12/2007 | Marks et al. | |
| 2008/0017854 A1 * | 1/2008 | Marks et al. | 257/43 |
| 2008/0161524 A1 | 7/2008 | Yan et al. | |
| 2008/0224127 A1 | 9/2008 | Marks et al. | |

OTHER PUBLICATIONS

Ha et al., "Flexible Low-Voltage Organic Thin-Film Transistors Enabled by Low-Temperature, Ambient-Solution-Processable Inorganic/Organic Hybrid Gate Dielectrics," *J. Am. Chem. Soc.*, 132(49): 17426-17434 (Nov. 18, 2010).

* cited by examiner

*Primary Examiner* — Nikolay Yushin
(74) *Attorney, Agent, or Firm* — Karen K. Chan

(57) ABSTRACT

Disclosed are thin film transistor devices incorporating a crosslinked inorganic-organic hybrid blend material as the gate dielectric. The blend material, obtained by thermally curing a mixture of an inorganic oxide precursor sol and an organosilane crosslinker at relatively low temperatures, can afford a high gate capacitance, a low leakage current density, and a smooth surface, and can be used to enable satisfactory transistor device performance at low operating voltages.

20 Claims, 6 Drawing Sheets

CROSSLINKED HYBRID GATE DIELECTRIC MATERIALS AND ELECTRONIC DEVICES INCORPORATING SAME

CROSS REFERENCE TO RELATED APPLICATIONS

This application claims priority to and the benefit of U.S. Provisional Patent Application Ser. No. 61/346,245, filed on May 19, 2010, the disclosure of which is incorporated by reference herein in its entirety.

STATEMENT REGARDING FEDERALLY SPONSORED RESEARCH OR DEVELOPMENT

This invention was made with government support under Grant Number N00014-05-1-0541 awarded by the Office of Naval Research, Grant Number DMR-0520513 awarded by the National Science Foundation, and Grant Number FA9550-08-1-0331 awarded by the Air Force Office of Scientific Research. The government has certain rights in the invention.

BACKGROUND

Organic thin-film transistors (OTFTs)-based electronics performing simple operations offer unique attractions compared to conventional inorganic technology, including low-cost large-area coverage, and low processing temperatures suitable for flexible substrates. A typical OTFT includes a number of layers and can be configured in various ways. For example, a bottom-gate top-contact OTFT includes a substrate with a gate electrode thereon, a dielectric layer deposited over the gate electrode, a semiconductor layer in contact with the dielectric layer, and source and drain electrodes separated from each other and deposited on the semiconductor layer. In this device architecture, the current between the source electrode and the drain electrode is modulated by both the source-drain voltage ($V_{SD}$) and the source-gate voltage ($V_G$). When the device is in the off-state ($V_G=0V$), the channel current is very low, whereas in the on-state of the source-gate voltage ($V_G \neq 0V$), large current increase is observed. The saturation current in organic thin-film transistors is generally described by Equation 1

$$I_{DS} = \frac{W}{2L} \mu C_i (V_G - V_T)^2, \quad (1)$$

where, $\mu$ is the field-effect charge carrier mobility, $C_i$ is the capacitance per unit area of the dielectric, $V_T$ is the threshold voltage, and W and L are the OTFT channel width and length, respectively. Despite recent impressive progress of new organic semiconductors, large OTFT operating voltages, reflecting the intrinsically low mobilities of organic semiconductors compared to conventional inorganic semiconductors, remain one of the major challenges to overcome. For low power applications such as RFID, displays, and portable electronics, it is mandatory to achieve high TFT drain currents ($I_{SD}$) at acceptably low operating voltages. Without changing device geometry (W and L) and semiconductor material ($\mu$), equivalent OTFT $I_{SD}$ can be achieved at lower operating voltages by increasing the gate dielectric capacitance $C_i$, given by Equation 2

$$C_i = \varepsilon_0 \frac{k}{d}, \quad (2)$$

where $\varepsilon_0$ is the vacuum permittivity, k is the dielectric constant, and d is the thickness of dielectric layer. From Equation 2, it can be seen that operating bias reduction can be achieved by increasing the dielectric constant (k) or decreasing the thickness (d) of the gate dielectric. An increase of the k/d ratio is also essential for efficient device scalability, a prerequisite to improving low-power TFT operation.

Gate electric materials that can be processed by solution and at low temperatures are important to enable compatibility with flexible plastic substrates. Crosslinked polymer films, inorganic metal oxides, polymer/high-k nanoparticle composites and hybrid organic/inorganic dielectrics have been investigated as candidates for low-voltage TFTs. However, many of these dielectrics have limitations in achieving practical applications for flexible low-voltage TFTs. For example, crosslinked polymer materials have relatively low-k values and thus TFT drain currents ($I_{SD}$) at low operating voltages often are not sufficiently high. An alternative approach is to employ high-k materials such as metal oxide (MO) films. However, high-quality MO dielectric films often require high growth/annealing temperatures (>400° C.) or vacuum conditions (atomic layer or chemical/physical vapor deposition) to ensure low leakage currents. Furthermore, most high-k metal oxide materials, particularly crystalline metal oxide materials, are often too brittle for flexible applications. Another method to increase the k/d ratio and mechanical flexibility is to use polymer-high k inorganic nanoparticle composites. However, because the dielectric constant of these composite materials is dominated by the relatively low-k polymer component, a large nanoparticle load is necessary to increase the k value of the composite, resulting in increased surface roughness. Lastly, although hybrid gate dielectrics composed of self-assembled monolayers or multilayers on ultrathin inorganic oxides show promise for low-voltage OTFTs, their integration into large-volume coating processes can be difficult.

Therefore, there is a need in the art for dielectric materials that can be prepared at low temperatures via solution-phase processes and that can enable low-voltage TFTs.

SUMMARY

In light of the foregoing, the present teachings relate to a crosslinked inorganic-organic hybrid blend material which can have good film and dielectric properties, and can be used as a gate dielectric in both organic and inorganic thin film transistors to enable satisfactory device performance at low operating voltages (e.g., <±10 V). The crosslinked hybrid blend (CHB) dielectric material generally can be obtained by thermally curing a mixture of an inorganic oxide precursor sol and an organosilane crosslinker at relatively low temperatures as detailed herein.

Accordingly, the present teachings also relate to thin film transistors that include a dielectric component comprising the crosslinked inorganic-organic hybrid blend material described herein and methods of fabricating such thin film transistors.

The foregoing as well as other features and advantages of the present teachings will be more fully understood from the following figures, description, examples, and claims.

BRIEF DESCRIPTION OF DRAWINGS

It should be understood that the drawings described below are for illustration purposes only. The drawings are not necessarily to scale, with emphasis generally being placed upon illustrating the principles of the present teachings. The drawings are not intended to limit the scope of the present teachings in any way.

DETAILED DESCRIPTION

Figure 1:
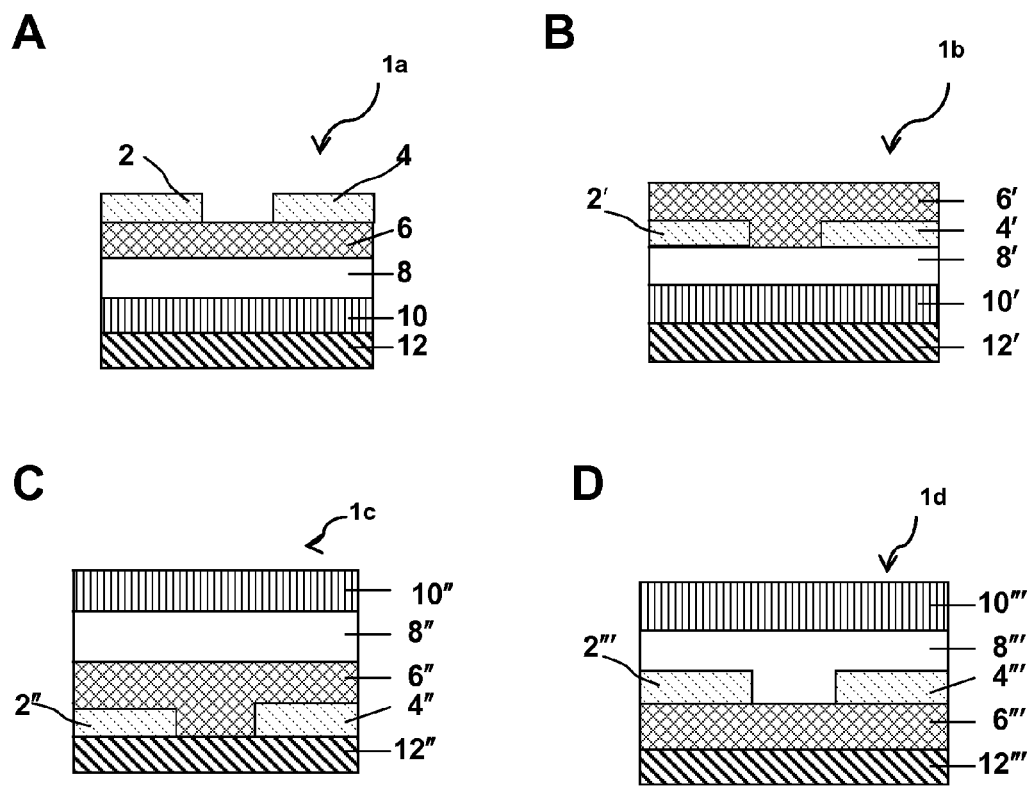
FIG. 1 illustrates four different configurations of thin film transistors (TFTs): bottom-gate top-contact (A), bottom-gate bottom-contact (B), top-gate bottom-contact (C), and top-gate top-contact (D) TFTs.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

The present teachings, in part, provide a crosslinked inorganic-organic hybrid blend material that can exhibit good electrically insulating or dielectric properties, which together with desirable mechanical characteristics such as robustness and surface smoothness, render them useful as dielectric components for various electronic devices, in particular, low-voltage thin film transistors.

The present hybrid blend material can be prepared via solution-phase methods with relatively low annealing temperatures. Specifically, the blend material can be obtained by thermally curing a precursor solution (or hereinafter "blend composition") that includes an inorganic oxide precursor sol and an organosilane crosslinker at a temperature less than about 300° C.

In various embodiments, the inorganic oxide precursor sol can be prepared by dissolving one or more metal oxide precursors such as metal chlorides, metal alkoxides, or combinations thereof, in a solvent or solvent mixture. The metal oxide precursors can undergo various forms of hydrolysis and polycondensation reactions upon annealing to form a metal-oxygen-metal lattice. In certain embodiments, the metal oxide precursors can include a metal selected from Zr, Ti, Hf, and Ta. In particular embodiments, the precursor sol can be a zirconia sol which includes a zirconium compound such as $ZrCl_4$, $ZrOCl_2$, and $Zr(OR)_4$, wherein each R independently can be a $C_{1-6}$ alkyl group. To accelerate hydrolysis, the precursor sol can include a hydrolyzing catalyst such as an acid. The solvent or solvent mixture can include water and/or one or more organic solvents, for example, various alcohols, aminoalcohols, carboxylic acids, glycols, hydroxyesters, aminoesters, and mixtures thereof. In certain embodiments, the solvent or solvent mixture can be selected from water, methanol, ethanol, propanol, butanol, pentanol, hexyl alcohol, heptyl alcohol, ethyleneglycol, methoxyethanol, ethoxyethanol, methoxypropanol, ethoxypropanol, methoxybutanol, dimethoxyglycol, N,N-dimethylformamide, and mixtures thereof.

The organosilane crosslinker typically is α,ω-functionalized with one or more hydrolyzable groups. In various embodiments, the organosilane crosslinker can be represented by the formula:

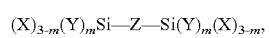

wherein X, at each occurrence, independently can be selected from a halide, an amino group, an alkoxy group, and a carboxylate group; Y, at each occurrence, independently can be selected from H, an alkyl group, and a haloalkyl group; Z can be a divalent organic group comprising 1 to 20 carbon atoms; and m, at each occurrence, independently can be selected from 0, 1, and 2. To illustrate, Z can be a divalent $C_{1-20}$ alkyl group (linear or branched), a divalent $C_{1-20}$ haloalkyl group (where one and up to all of the hydrogen atoms in the alkyl group can be replaced with a halide such as F or Cl), or a divalent $C_{1-20}$ alkyl group where at least one of the $CH_2$ groups is replaced by O. In most embodiments, Z can be an organic group that does not include easily hydrolyzable bonds. In certain embodiments, X, at each occurrence, independently can be selected from F, Cl, —$NR^1R^2$, —$OR^3$, and —$OC(O)R^3$, where $R^1$ and $R^2$, at each occurrence, independently can be H or a $C_{1-6}$ alkyl group, and $R^3$, at each occurrence, independently can be selected from H, a $C_{1-6}$ alkyl group, and a $C_{1-6}$ haloalkyl group. In particular embodiments, X, at each occurrence, independently can be selected from Cl, —$OCH_3$, —$OCH_2CH_3$, —$OC(O)CH_3$, and —$OC(O)CH_2CH_3$. In various embodiments, m can be 0. In particular embodiments, the organosilane crosslinker can be a bis(silyl) alkane comprising 4 to 10 carbon atoms, where each silyl group can be functionalized with at least one alkoxy group. Specific examples of organosilane crosslinkers for practicing the present teachings include: $[CH_3C—O]_3Si—(CH_2)_6—Si[O—CH_3]_3$, $[C_2H_5C—O]_3Si—(CH_2)_8—Si[O—C_2H_5]_3$, $[CH_3C(O)O]_3Si—(CH_2)_3—O—(CH_2)_2—O—(CH_2)_3—Si[CH_3C(O)O]_3$, $Cl_3Si—(CH_2)_3—O—(CH_2)_2—O—(CH_2)_3—SiCl_3$, $(CH_3O)_3Si—(CH_2)_2$-phenyl-$(CH_2)_2—Si(OCH_3)_3$, $Cl_3Si—(CH_2)_2—(CF_2)_2—(CH_2)_2—SiCl_3$, and $[CH_3C(O)O]_3Si—(CH_2)_2(CF_2)_2(CH_2)_2—Si[CH_3C(O)O]_3$.

The organosilane crosslinker reacts with the inorganic oxide precursor sol as the inorganic oxide precursors undergo various hydrolysis and condensation reactions to become an inorganic oxide gel, and upon annealing, the organosilane crosslinker and the inorganic component together form a crosslinked insoluble network. Without wishing to be bound to any particular theory, it is believed that alkoxy-functionalized organosilane crosslinker can lead to better film properties in some embodiments, due to the relatively slow condensation reaction between the alkoxy groups of the crosslinker and the hydroxyl groups of the inorganic oxide gel. For example, the resulting films can be denser and more robust, hence providing improved leakage current property. The distance between the two silyl groups in the organosilane crosslinker also can contribute to slightly different film properties. For example, in embodiments where a bis(silyl)alkane is used as the crosslinker, the alkane can have between about 5 to about 10 carbon atoms, preferably between about 6 to about 8 carbon atoms. The relative molar ratio of the inorganic oxide precursor and the organosilane crosslinker in the blend composition also can be modified to vary film properties. Generally, the metal oxide precursors are present in the blend composition at a molar concentration in excess of the organosilane crosslinker. For example, the metal oxide precursors can be present in the blend composition at a molar concentration between about 2 times and about 10 times of the molar concentration of the organosilane crosslinker.

The present crosslinked hybrid blend dielectric film can be prepared via various solution-phase deposition methods. Exemplary solution-phase deposition methods include printing (e.g., inkjet printing and various contact printing techniques such as screen-printing, gravure printing, offset printing, pad printing, lithographic printing, flexographic printing, and microcontact printing), spin-coating, drop-casting, zone casting, dip coating, blade coating, spraying, rod coating, or stamping. In particular embodiments, the blend composition described herein can be spin-coated onto a substrate at a sufficient speed and for a sufficient period of time to achieve the desired thickness, followed by thermal curing at relatively low temperatures. For example, the annealing temperature can be less than about 400° C., less than about 300° C., or less than about 200° C. (e.g., about 150° C.), and can be carried out by various methods known in the art, for example, by using resistive elements (e.g., ovens), IR radiation (e.g., IR lamps), microwave radiation (e.g., microwave ovens), and/or magnetic heating. In particular embodiments, thermal curing of the blend composition can take place at a temperature between about 70° C. and about 150° C. in an atmosphere having a relative humidity ranging from about 5% to about 95%. Instead of or in addition to thermal curing, the blend composition can be exposed to ultraviolet light to induce crosslinking. Typically, the thickness of the present crosslinked hybrid blend film can range from about 10 nm to about 50 nm, although thicker films, if desired, can be easily obtained with multiple spin-coating cycles.

The present crosslinked hybrid blend dielectrics can exhibit excellent insulating properties including low leakage current densities (<about $10^{-6}$ Acm$^{-2}$), tunable capacitance (95~385 nF cm$^{-2}$), and a high dielectric constant k (4.6~8.7). The present crosslinked hybrid blend films also show good surface morphologies and can form good interfaces with various semiconducting materials, including organic semiconducting compounds.

The desirable dielectric and interfacial properties of the present hybrid blend dielectrics render them compatible with diverse groups of semiconductor materials (including both inorganic and organic semiconductors) and suitable as dielectric materials in various electronic devices. Thin-film transistors fabricated with the present hybrid blend materials as the dielectric material and various inorganic and organic thin film semiconductors can exhibit high mobilities and current on/off ratios while enabling significantly reduced operating voltages (<±10 V) compared with conventional $SiO_2$ dielectrics (±100V).

Accordingly, in one aspect, the present teachings can relate to a method of fabricating a thin film transistor. A thin film transistor can have different configurations as shown in FIG. 1, including bottom-gate top-contact structure (A), bottom-gate bottom-contact structure (B), top-gate bottom-contact structure (C), and top-gate top-contact structure (D). A thin film transistor generally includes a substrate (12, 12', 12", and 12'''), electrical conductors (source/drain conductors 2, 2', 2", 2''', 4, 4', 4", and 4'''), and gate conductors 10, 10', 10", and 10'''), a dielectric component 8, 8', 8", and 8''' coupled to the gate conductor, and a semiconductor component 6, 6', 6", and 6''' coupled to the dielectric on one side and in contact with the source and drain conductors on the other side. As used herein, "coupled" can mean the simple physical adherence of two materials without forming any chemical bonds (e.g., by adsorption), as well as the formation of chemical bonds (e.g., ionic or covalent bonds) between two or more components and/or chemical moieties, atoms, or molecules thereof.

The present methods of fabricating a thin film transistor can include forming a crosslinked hybrid dielectric film by thermally curing (e.g., at a temperature less than about 300° C.) a blend composition deposited on a substrate, where the blend composition includes an inorganic oxide precursor sol and an organosilane crosslinker; and forming a thin film semiconductor adjacent to the crosslinked hybrid blend dielectric film. The thin film semiconductor can be deposited by various methods known in the art, including both vapor-phase methodologies (e.g., atomic layer or chemical/physical vapor deposition) and solution-phase methodologies (e.g., printing, spin-coating, drop-casting, zone casting, dip coating, blade coating, spraying, rod coating, or stamping).

In some embodiments, the thin film semiconductor can be a metal oxide. Exemplary semiconducting metal oxides include indium oxide ($In_2O_3$), tin-doped indium oxide (ITO), indium zincoxide (IZO), zinc tin oxide (ZTO), indium gallium oxide (IGO), indium-gallium-zinc oxide (IGZO), tin oxide (SnO$_2$), and zinc oxide (ZnO). In certain embodiments, the metal oxide thin film semiconductor can be deposited by a solution-phase method. In particular embodiments, the metal oxide thin film semiconductor can be formed by a sol-gel process.

In some embodiments, the thin film semiconductor can include one or more organic compounds, for example, one or more semiconducting molecules and/or polymers. Exemplary semiconducting molecules and polymers include various fused heterocycles, aromatic hydrocarbons (e.g., pentacene), polythiophenes, fused (hetero)aromatics (e.g., perylene imide and naphthalene imide small molecule or polymers), and other such organic semiconductor compounds or materials, whether p-type or n-type, otherwise known or found useful in the art. In various embodiments, the organic thin film semiconductor can be vapor-deposited, spin-coated, or printed.

The method also can include forming source and drain electrodes in contact with the thin film semiconductor (for example, deposited on top of the thin film semiconductor for top-contact structures, or deposited on top of the hybrid multilayer dielectric layer for bottom-contact structures). The gate electrode and the other electrical contacts (source and drain electrodes) independently can be composed of metals (e.g., Au, Ag, Al, Ni, Cu), transparent conducting oxides (e.g., ITO, IZO, ZITO, GZO, GIO, GITO), or conducting polymers (e.g., poly(3,4-ethylenedioxythiophene) poly(styrenesulfonate) (PEDOT:PSS), polyaniline (PANI), or polypyrrole (PPy)). For embodiments where the electrical contacts are composed of a metal, vacuum deposition can be used, typically through a shadow mask.

The substrate component for a thin film transistor can be selected from doped silicon, glass, aluminum or other metals alone or coated on a polymer or other substrate, as well as polyimide or other plastics. In certain embodiments, the substrate can be a flexible plastic such as a polyimide film (e.g., KAPTON® from Dupont).

The following examples are provided to illustrate further and to facilitate the understanding of the present teachings and are not in any way intended to limit the invention.

EXAMPLE 1

Crosslinked Hybrid Blend (CHB) Dielectric Film Fabrication and Characterization

Crosslinked hybrid blend (CHB) thin films were prepared from a blend solution that includes an organosilane crosslinker and a zirconia sol. Specifically, zirconium (IV) chloride (99.5%, Aldrich) was dissolved in ethanol (absolute >99.5%, Aldrich) to give a 0.1 M solution, to which was added a mixture of nitric acid and deionized water (molar ratio; ZrCl$_4$:HNO$_3$:H$_2$O=1:10:10). This zirconium precursor solution was then heated to 50° C. for 3 h to accelerate hydrolysis to provide a zirconia sol. The organosilane crosslinker (bis(trimethoxysily)hexane, BTH (98%, Gelest), or bis(triethoxysily)octane, BTO (98%, Gelest)) was dissolved in EtOH to provide a 0.1 M crosslinker solution, which was then mixed with the zirconia sol in the following molar ratios: (a) 1:0.5, (b) 1:0.2, and (c) 1:0.1 (ZrCl$_4$:crosslinker) to provide three different blend solutions. Each of the blend solutions were filtered through a 0.2 μm pore size PTFE membrane syringe filter before spin-coating. CHB thin films were deposited onto substrates by spin-coating at 5000 rpm for 30 sec, followed by curing in a vacuum oven at 150° C. for 2 h.

Control zirconium oxide (ZrO$_x$) films were fabricated by spin-coating the zirconia sol (i.e., without the organosilane crosslinker) onto substrates at 5000 rpm for 30 sec, and then cured at 150° C., 300° C., 400° C., and 500° C. for 1 h.

The film thickness of the CHB dielectrics was analyzed with a profilometer (Veeco Dektak 150 surface profiler). The film thickness of the control ZrO$_2$ dielectrics at different annealing temperatures was analyzed by X-ray reflectivity (XRR) using CuKα radiation (Rigaku ATX-G Thin-film Diffraction Workstation). The morphologies of all thin films were evaluated by atomic force microscopy (AFM) using a JEOL-5200 scanning probe microscope with silicon cantilevers in the tapping mode.

Figure 2:
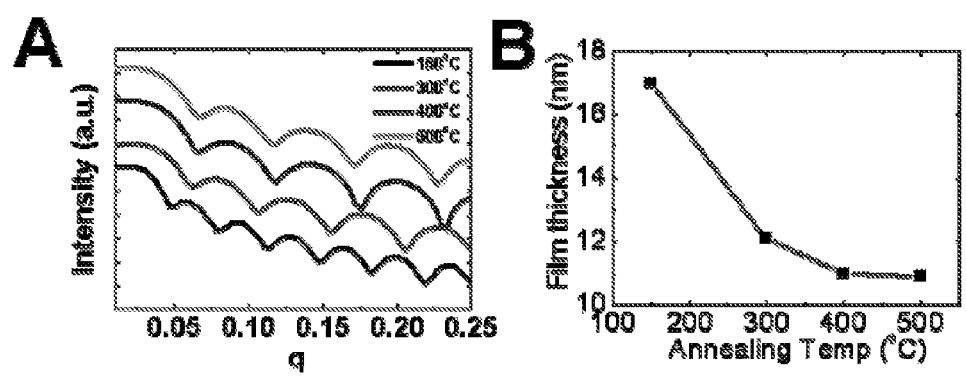
FIG. 2A shows X-ray reflectivity (XRR) plots for control $ZrO_2$ thin films fabricated on Si substrates and annealed at various temperatures.
FIG. 2B plots the XRR-derived film thickness of the control $ZrO_2$ thin films as a function of the annealing temperature.

As derived from XRR data, the control ZrO$_2$ films obtained at an annealing temperature of 150° C., 300° C., 400° C., and 500° C., respectively, have a film thickness of ~17.0 nm, ~12.1 nm, ~11.0 nm, and ~10.9 nm (FIG. 2), indicating that higher annealing temperatures (>400° C.) lead to thinner and denser films. This is consistent with the understanding that for solution-processed metal oxide films, metal hydroxides are gradually converted into the oxides via thermally-driven condensation processes (Zr—OH+OH—Zr→Zr—O—Zr+H$_2$O), and the degree of oxide formation depends primarily on the annealing temperature.

Profilometry established that the CHB films have a film thickness in the range of about 20 nm to about 43 nm. Thicker films, if required, can be obtained by varying the processing conditions or by multiple spin-on depositions (given that CHB films are insoluble in the mother solutions at all stages of curing).

Figure 3:
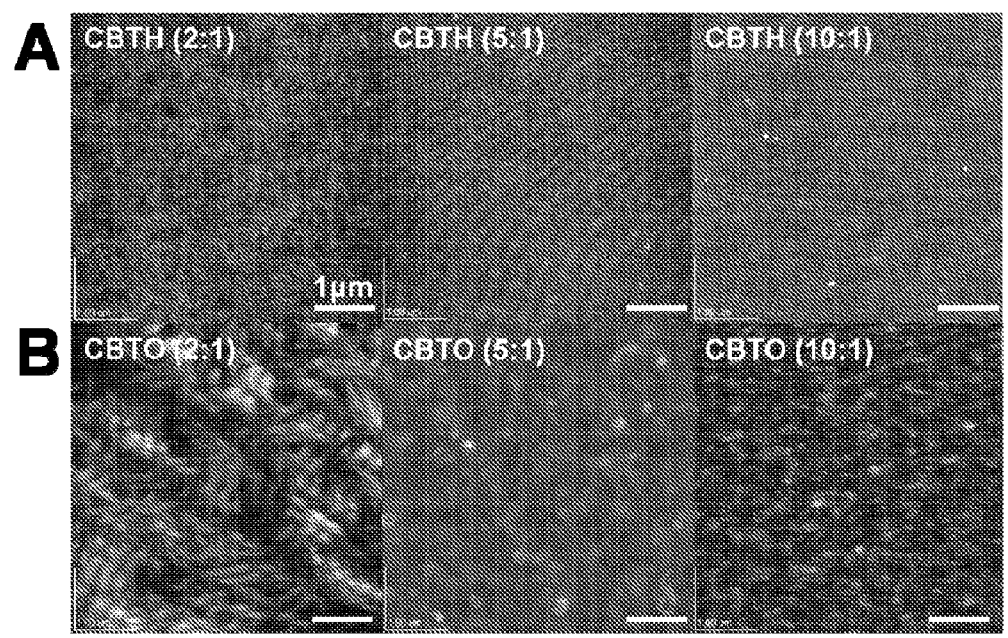
FIGS. 3A and 3B show AFM images of crosslinked hybrid blend dielectric films (CBTH (A) and CBTO (B) films) obtained from a blend composition having the indicated $ZrCl_4$:crosslinker molar ratio.

FIG. 3 shows AFM images of CBTH and CBTO films deposited from a zirconium chloride/BTH blend solution and a zirconium chloride/BTO blend solution, respectively. Independent of the ZrCl$_4$:crosslinker molar ratio, BTH was found to afford very smooth crosslinked surfaces (RMS roughness, ρ~0.2 nm). CHB films obtained with BTO have a higher RMS roughness (ρ=0.6-5 nm). Without wishing to be bound to any particular theory, the longer hydrocarbon chain in BTO may lead to more folding than BTH, which may lead to relatively rougher surfaces. This may also explain smoother films with a lower BTO molar ratio. These data suggest that the surface smoothness of the CHB films can be optimized by varying the molar ratio of the organosilane crosslinker and/or the number of carbon atoms in the organosilane crosslinker.

The dielectric properties of both CHB films and the control ZrO$_2$ films were assessed by metal-insulator-semiconductor (MIS) leakage and capacitance measurements. Metal-insulator-semiconductor (MIS) sandwich structures were fabricated by directly depositing gold electrodes (200 μm×200 μm) onto CHB or ZrO$_2$ dielectric-coated Si substrates through a shadow mask. MIS direct current measurements were carried out under ambient conditions using a Signatone probestation using Keithley 6430 Sub-Femtoamp Remote Source Meter and a Keithley 2400 source meter with a local LabVIEW program. An impedance analyzer (HP 4192A) was used for capacitance measurements.

Figure 4:
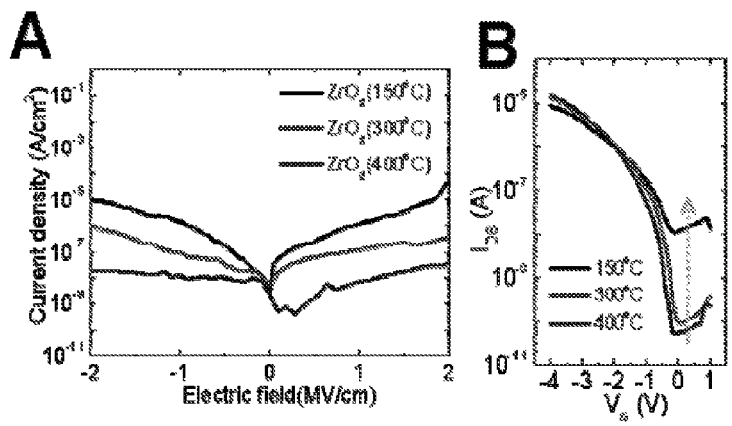
FIG. 4A shows leakage current density-electric field (J-E) plots for the control $ZrO_2$ dielectric films annealed at 150° C., 300° C., and 400° C.
FIG. 4B shows representative transfer plots for pentacene OTFTs based on the control $ZrO_2$ dielectrics of FIG. 4A.

FIG. 4A shows typical current density-electric field (J-E) plots for MIS structures fabricated with ZrO$_2$ dielectrics at different annealing temperatures. It can be seen that the leakage current density of these films increases as the annealing temperature decreases. Thus, high annealing temperatures (≧300° C.) are needed to obtain adequate dielectric strength (<10$^{-6}$ A/cm$^2$ at 2 MV/cm) with sol-gel-derived ZrO$_2$ thin films for typical OTFT operation (vide infra).

Figure 5:
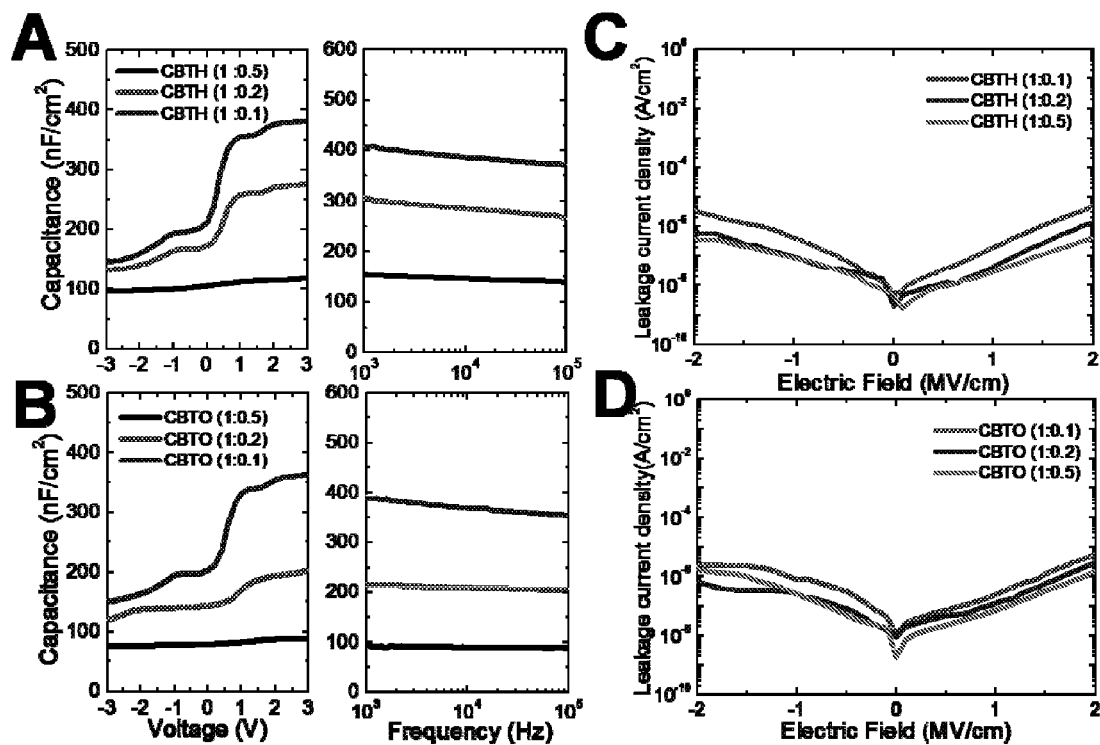
FIGS. 5A and 5B plot capacitance as a function of voltage measured at 10 kHz (left) and as a function of frequency measured at 3 V (right) for CBTH (A) and CBTO (B) films.
FIGS. 5C and 5D show leakage current density-electric field (J-E) plots for CBTH (C) and CBTO (D) films.

FIG. 5 shows the capacitance and leakage current density measurements for MIS structures fabricated with CBTH and CBTO dielectrics. It can be seen that the CBTH and CBTO devices exhibit leakage current densities that are at least 10 times lower (<1×10$^{-6}$ A/cm$^2$) than the leakage current densities exhibited by the ZrO$_2$ devices (~1×10$^{-5}$ A/cm$^2$) at the same bias window (2 MV/cm). Further, it was observed that the leakage current density of the CHB devices decreases as the molar ratio of the organosilane crosslinker increases. Without wishing to be bound to any particular theory, it is believed that this is the result of the improved crosslinked network that affords denser films, as compared to inorganic-only films when annealed at low annealing temperature. However, CV measurements show that by increasing the molar ratio of the organosilane crosslinker, the film capacitance decreases. Without wishing to be bound to any particular theory, it is believed that this is the result of (1) the dilution of the inorganic component in the blend and (2) increased film thickness. It should be noted that compared to the capacitance of a 300 nm thick SiO$_2$ dielectric (~11 nF/cm$^2$), the present CHB dielectrics can obtain much higher capacitance (95~385 nF/cm$^2$). From the accumulation regime capacitances, k values of 4.6~8.7 are obtained for the two organosilane crosslinkers at the three different molar ratios investigated. These values are quite comparable with other inorganic materials, and are higher than conventional SiO$_2$ dielectrics (3.9) as well as other dielectric materials based upon a polymer-inorganic nanoparticle nanocomposite (see e.g., Kim, P., Zhang, X.-H., Domercq, B., Jones, S. C., Hotchkiss, P. J., Marder, S. R., Kippelen, B. and Perry, J. W. *Appl. Phys. Lett.*, 93013302 (2008); Jung, C., Maliakal, A., Sidorenko, A. and Siegrist, T. *Appl. Phys. Lett.*, 90062111 (2007); Maliakal, A., Katz, H., Cotts, P. M., Subramoney, S, and Mirau, P. *J. Am. Chem. Soc.*, 127: 14655 (2005); and Schroeder, R., Majewski, L. A. and Orrell, M. *Adv. Mater.*, 17: 1535 (2005)). As demonstrated by the leakage current and capacitance measurements, the CHB films have good dielectric properties and can be used as dielectric materials, for example, in thin film transistor devices. Table 1 below summarizes various film and dielectric properties of the CHB dielectrics.

TABLE 1

Various film and dielectric properties for CHB and control ZrO$_2$ dielectrics.

| Dielectric Film | Cross-linker (Cx) | Zr:Cx ratio | T$_a$ (° C.) | Film Thickness (nm) | J (A/cm$^2$) | ε |
|---|---|---|---|---|---|---|
| ZrO$_2$ | None | 1:0 | 150 | 17.0 | ~5 * 10$^{-5}$ | 9 |
| | | | 300 | 12.1 | ~1 * 10$^{-6}$ | 10 |
| | | | 400 | 11.0 | ~3 * 10$^{-8}$ | 11 |
| | | | 500 | 10.9 | ~2 * 10$^{-8}$ | 11 |
| CBTH | BTH | 1:0.5 | 150 | 35 | ~4 * 10$^{-7}$ | 5.4 |
| | | 1:0.2 | | 23 | ~1 * 10$^{-6}$ | 7.1 |
| | | 1:0.1 | | 19 | ~4 * 10$^{-6}$ | 8.7 |
| CBTO | BTO | 1:0.5 | 150 | 43 | ~1 * 10$^{-6}$ | 4.6 |
| | | 1:0.2 | | 27 | ~3 * 10$^{-6}$ | 6.1 |
| | | 1:0.1 | | 20 | ~6 * 10$^{-6}$ | 8.3 |

EXAMPLE 2

Thin Film Transistor (TFT) Fabrication

Thin film transistors based upon different semiconductors and substrates and incorporating CHB films as the gate dielectric were fabricated. Control TFT devices were fabricated with ZrO$_2$ films as the gate dielectric. TFT measurements were carried out under ambient conditions using a Signatone probestation using Keithley 6430 Sub-Femtoamp Remote Source Meter and a Keithley 2400 source meter with a local LabVIEW program. From the I-V data, the average field-effect mobility was calculated in the saturation regime ($V_G<V_{DS}=-4$ V) by plotting the square root of the drain current versus gate voltage.

Using pentacene as a representative organic semiconductor, bottom-gate, top-contact OTFTs incorporating CHB films as the gate dielectric were fabricated on silicon substrates and plastic substrates, respectively, as follows. Control TFTs incorporating a ZrO$_2$ dielectric were fabricated following analogous procedures. In each case, the OTFTs have a channel length (L) of about 100 μm and a channel width (W) of about 2000 μm.

Heavily doped n$^+$-type Si wafers (Montco Silicon Technologies, Inc.) were cleaned in EtOH (Aldrich, absolute, 200 proof) with sonication for 2 min and then dried with flowing nitrogen, followed by oxygen plasma treatment for 5 min to remove organic contamination and to improve their wetting ability. The CHB dielectric layer was deposited as described in Example 1. Pentacene was vacuum deposited onto the CHB-coated Si substrate (50 nm, 5×10$^{-6}$ Torr 0.05 nm/s). Gold source/drain electrodes were vacuum-deposited (50 nm, 0.02 nm/s) through a shadow mask.

Flexible OTFTs were fabricated by vacuum-depositing aluminum as the gate electrode on a plastic substrate (KAPTON®), depositing the dielectric layer as described in Example 1, vacuum-depositing pentacene (50 nm, 5×10$^{-6}$ Torr 0.05 nm/s) onto the dielectric-coated Al/KAPTON® substrate, and thermally evaporating gold (50 nm, 0.02 nm/s) as the source/drain electrodes through a shadow mask.

Inorganic TFTs were fabricated with a solution-phase deposited indium tin oxide (ITO) thin film semiconductor as follows. An indium tin oxide precursor solution was first prepared by dissolving InCl$_3$ and SnCl$_4$ at various molar ratios [In$^{3+}$:(In$^{3+}$+Sn$^{4+}$)=1 to 9, total metal concentration 1 mM] in 1 mL of 2-methoxyethanol in a 2.5 mL capacity vial. To this solution, ethanolamine (0.03 ml, 0.5 mmol) was added into each vial and the clear solutions were then stirred for 30 min at room temperature before spin-coating. CBTH-coated (ZrCl$_4$:crosslinker molar ratios=1:0.5) Si substrates were rinsed with absolute ethanol and dried with an N$_2$ stream. The semiconductor was deposited by spin-coating the ITO precursor solution onto these substrates at the speed of 3000 rpm for 30 sec. Subsequently, the spin-coated films were annealed on a hotplate at 250° C. for 1 hour. After cooling to room temperature, the spin-coating process was repeated two times. Gold source/drain electrodes were vacuum-deposited (50 nm, 0.02 nm/s) through a shadow mask. The channel length (L) and width (W) are 100 μm and 2000 μm, respectively.

FIG. 4B shows the transfer plots of pentacene OTFTs based on ZrO$_2$ control films which were annealed at 150° C.→400° C.). It can be seen that the hole mobility improves from 0.1 cm$^2$/V·s to 0.4 cm$^2$/V·s as the annealing temperature increases from 150° C. to 400° C.

Figure 6:
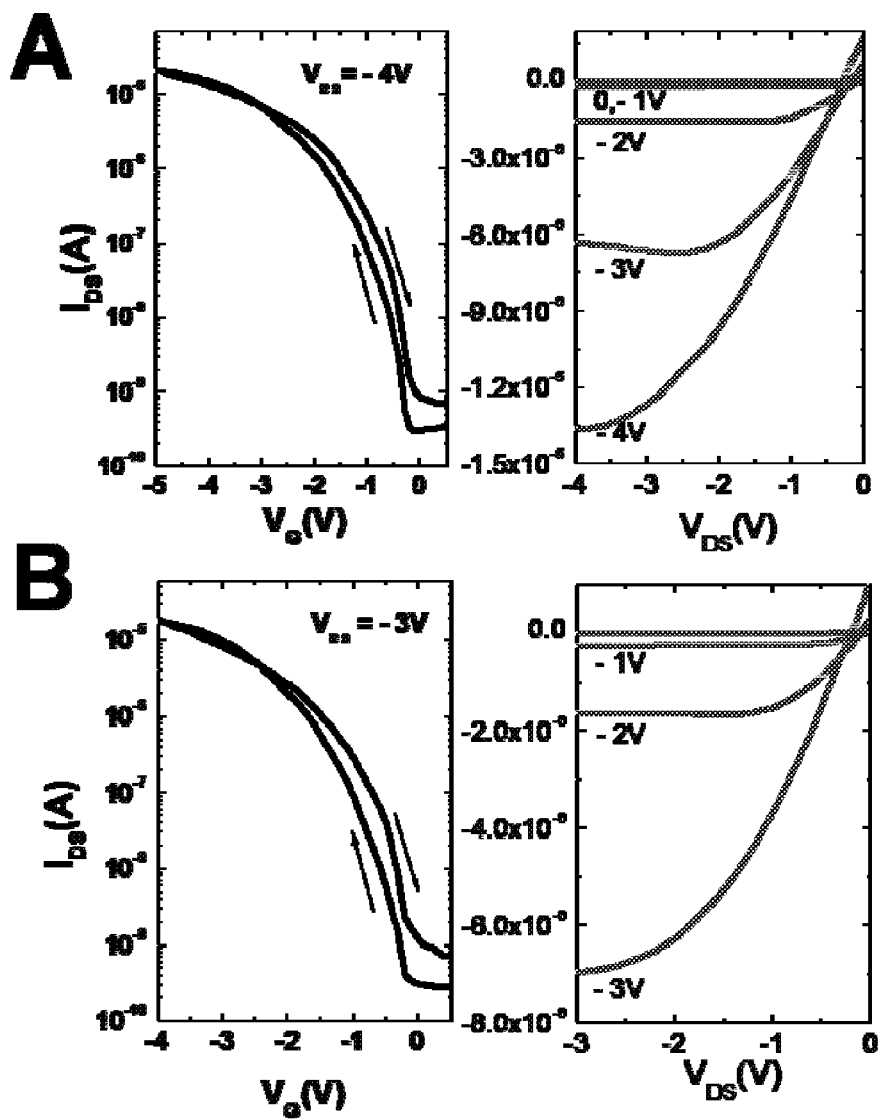
FIGS. 6A and 6B show transfer (left) and output (right) plots for pentacene OTFTs based on CHB dielectrics obtained with a $ZrCl_4$:crosslinker molar ratio of 1:0.5 (A) and 1:0.2 (B), respectively.

FIG. 6 shows representative transfer plots for OTFTs with the CHB gate dielectric annealed at 150° C. Table 2 summarizes the transistor characteristics of the CHB devices.

TABLE 2

Zirconium Chloride/Crosslinker Molar Ratio, Capacitance ($C_i$, nF/cm$^2$), Dielectric RMS Roughness ($\rho$, nm), OTFT Carrier Mobility ($\mu_{sat}$, cm$^2$/Vs), and Current On/Off Ratio ($I_{on}$:$I_{off}$) Data for OTFT/MIS Devices Fabricated Using P5 as the Organic Semiconductor and Various ZrO$_2$ and CHB Dielectrics.

| Dielectric Film | Crosslinker | Ratio | $T_a$ (° C.) | $C_i$ | $\rho$ | $\mu_{sat}$ | $I_{on}/I_{off}$ | $V_{TH}$ |
|---|---|---|---|---|---|---|---|---|
| ZrO$_2$ | None | 1:0 | 150 | 390 | 0.2 | 0.1 | 10$^4$ | −0.7 |
|  |  |  | 300 | 567 | 0.2 | 0.3 | 10$^5$ | −1.0 |
|  |  |  | 400 | 700 | 0.2 | 0.4 | 10$^5$ | −1.1 |
|  |  |  | 500 | 700 | 0.2 | 0.4 | 10$^5$ | −1.1 |
| CBTH | BTH | 1:0.5 | 150 | 135 | 0.2 | 1.5 | 10$^5$ | −1.2 |
|  |  | 1:0.2 |  | 275 | 0.2 | 1.0 | 10$^5$ | −1.1 |
|  |  | 1:0.1 |  | 385 | 0.2 | 0.7 | 10$^4$ | −1.0 |
| CBTO | BTO | 1:0.5 | 150 | 95 | 0.6 | 0.2 | 10$^3$ | −1.8 |
|  |  | 1:0.2 |  | 200 | 1.3 | 0.3 | 10$^4$ | −1.5 |
|  |  | 1:0.1 |  | 365 | 5 | 0.6 | 10$^4$ | −1.1 |

Referring to the data in FIG. 6 and Table 2, it can be seen that OTFTs based on CHB films require far lower annealing temperatures to operate properly when compared to the ZrO$_2$ control devices. Specifically, the CHB devices all exhibit excellent linear and saturation regime characteristics and minimal hysteresis when operated at −4 V. Furthermore, because all CHB dielectric films are very smooth, each of the tested CHB devices exhibits satisfactory device performance. In particular, pentacene TFTs fabricated with the CBTH dielectric obtained with a ZrCl$_4$:BTH molar ratio of 1:0.5 show exceptional device characteristics with a mobility of about 1.5 cm$^2$/V·s, a current on/off ratio of ~10$^5$, and a threshold voltage of about −1.2 V, respectively. TFTs based on CBTO also exhibit performance with $\mu$ approaching about 0.6 cm$^2$/V·s, $I_{on/off}$~10$^4$, and $V_{TH}$~−1.1 V. These carrier mobilities are far larger than those of control devices fabricated with a conventional 300 nm thick SiO$_2$ gate dielectric ($\mu$~0.3 cm$^2$/V·s). Further, the operating voltage is only −4V versus −100V for SiO$_2$ as a result of the greater capacitance of CHB films.

With continued reference to the data in Table 2, among the tested CHB devices, it is suggested that optimum performance for CBTH devices was obtained with a ZrCl$_4$:BTH molar ratio of 1:0.5, and for CBTO devices ZrCl$_4$:BTO=1:0.1. For CBTH devices, the gate capacitance was observed to increase as the ZrCl$_4$:BTH molar ratio increases. However, the dielectric strength was observed to decrease with increasing ZrCl$_4$:BTH molar ratios, possibly due to the less dense films. In contrast, the CBTO devices show improved performance with increasing ZrCl$_4$:BTO molar ratios from 1:0.5 to 1:0.1, possibly as a result of the smoother film morphology.

Figure 7:
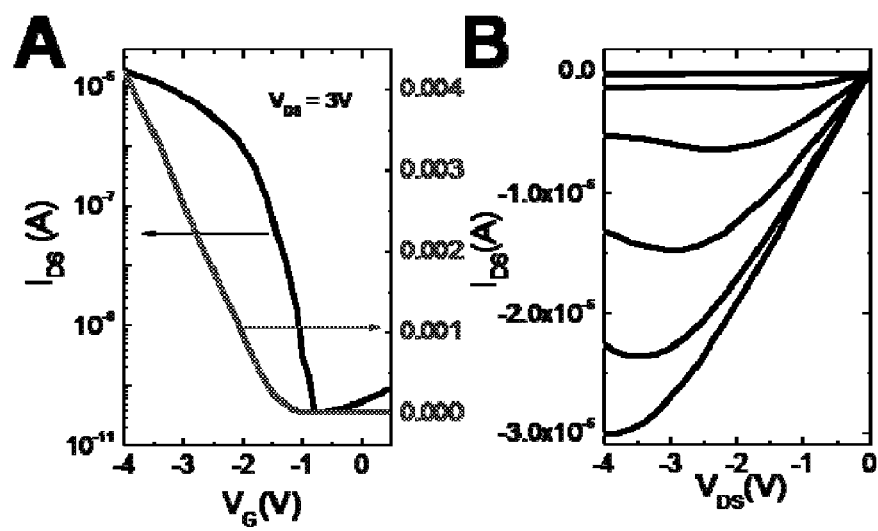
FIGS. 7A and 7B show transfer (A) and output (B) plots for a pentacene flexible OTFT based on a CBTH dielectric.
Figure 8:
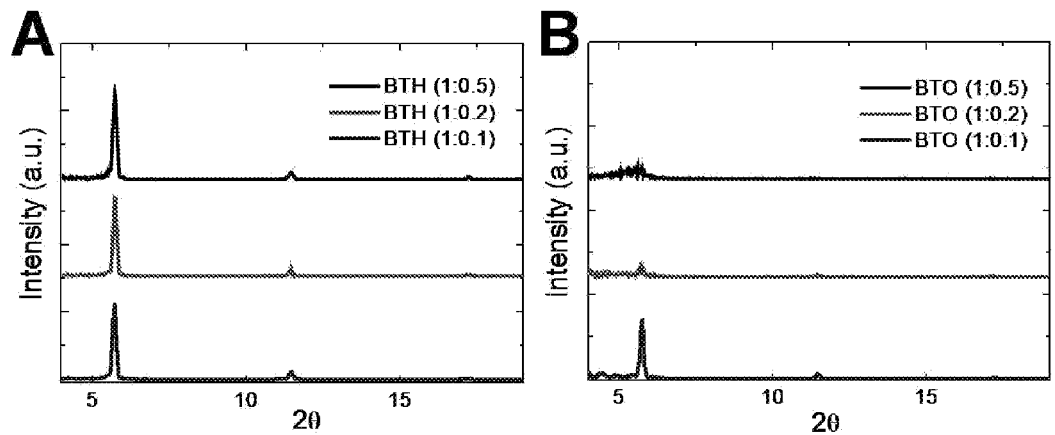
FIGS. 8A and 8B show X-ray diffraction patterns of pentacene films deposited on CBTH (A) and CBTO (B) dielectrics with the indicated $ZrCl_4$:crosslinker molar ratios.
Figure 9:
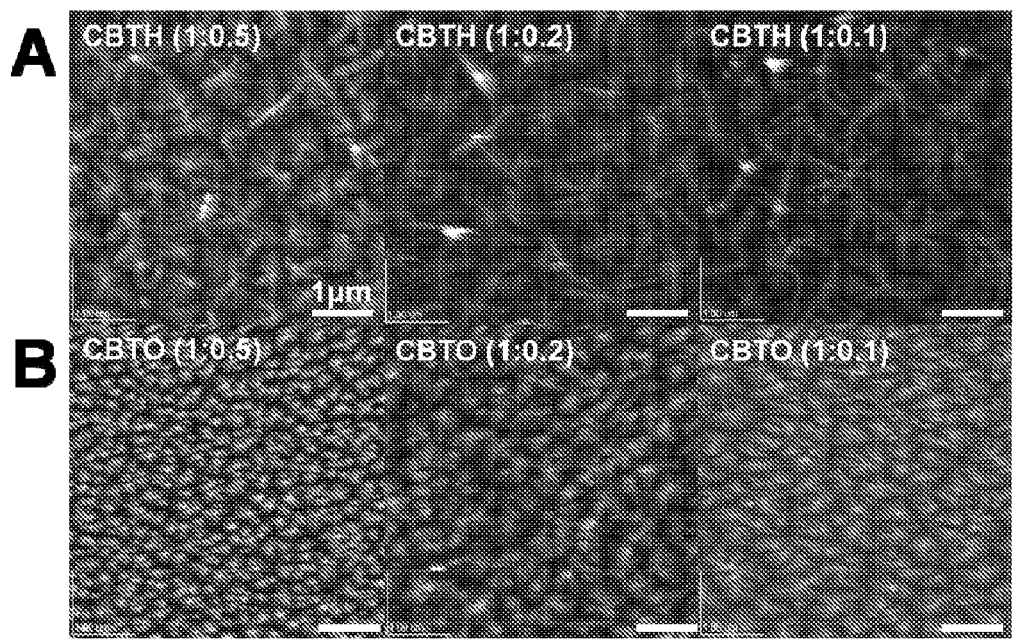
FIG. 9 shows AFM images of pentacene films on CBTH (A) and CBTO (B) dielectrics with the indicated $ZrCl_4$:crosslinker molar ratios. Images are 5 μm×5 μm in size.

FIG. 7 shows representative transfer and output plots for a flexible pentacene TFTs based on CBTH (ZrCl$_4$:BTH molar ratio=1:0.5). These plots demonstrate reproducible I-V characteristics at low operating voltages (<−4 V) as well as excellent linear/saturation behavior. The hole mobilities were measured to be ~1.6±0.2 cm$^2$/V·s and current on-off current ratios ~10$^5$. These properties are quite comparable to the TFTs fabricated on silicon wafer substrates. FIGS. 8 and 9 show XRR patterns and AFM images of pentacene films deposited on the present CBTH and CBTO dielectrics, confirming that the CBTH and CBTO dielectrics have good interfacial properties.

Figure 10:
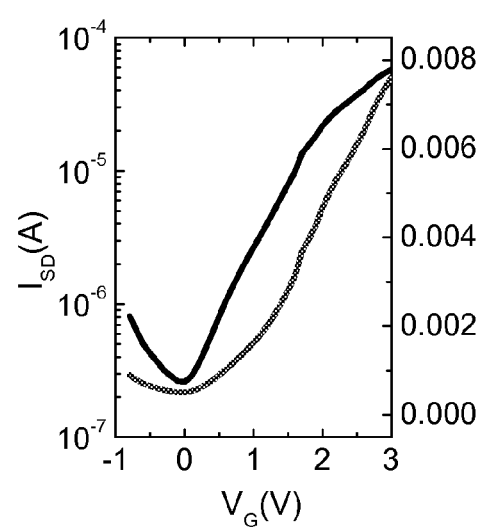
FIG. 10 shows transfer plots for tin-doped indium oxide (ITO) TFTs based on a CHB dielectric have a $ZrCl_4$:crosslinker molar ratio of 1:0.5.

FIG. 10 shows representative transfer plots of an inorganic TFT based upon an ITO semiconductor and a CHB dielectric. The data confirm that these inorganic TFTs also operate well at low operating voltages ($\mu$~0.1 cm$_2$/Vs and $I_{on/off}$>10$^2$) and demonstrate the applicability of CHB dielectrics in hybrid electronics.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

What is claimed is:

1. A thin film transistor comprising:
a thin film semiconductor;
source and drain electrodes in contact with the thin film semiconductor;
a dielectric layer adjacent the thin film semiconductor, wherein the dielectric layer comprises a thermally cured product of a blend composition comprising an inorganic oxide precursor sol and an organosilane crosslinker; and
a gate electrode in contact with the dielectric layer;
wherein the inorganic oxide precursor sol comprises one or more metal oxide precursors, and wherein the one or more metal oxide precursors are present in the blend composition at a molar concentration in excess of the organosilane crosslinker.

2. The thin film transistor of claim 1, wherein the metal oxide precursors are selected from metal chlorides, metal alkoxides, and combinations thereof.

3. The thin film transistor of claim 1, wherein the metal oxide precursors comprise a metal selected from Zr, Ti, Hf, and Ta.

4. The thin film transistor of claim 1, wherein the inorganic oxide precursor sol comprises a solvent or solvent mixture comprising an alcohol.

5. The thin film transistor of claim 1, wherein the inorganic oxide precursor sol comprises a hydrolyzing catalyst.

6. The thin film transistor of claim 1, wherein the one or more metal oxide precursors are present in the blend composition at a molar concentration between about 2 times and about 10 times the molar concentration of the organosilane crosslinker.

7. The thin film transistor of claim 1, wherein the organosilane crosslinker is functionalized with hydrolysable groups.

8. The thin film transistor of claim 1, wherein the organosilane crosslinker has the formula:

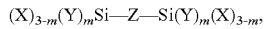

$(X)_{3-m}(Y)_m Si—Z—Si(Y)_m(X)_{3-m}$, wherein:
m, at each occurrence, independently is selected from 0, 1, and 2;
X, at each occurrence, independently is selected from a halide, an amino group, an alkoxy group, and a carboxylate group;
Y, at each occurrence, independently is selected from H, an alkyl group, and a haloalkyl group; and
Z is a divalent organic group comprising 1 to 20 carbon atoms.

9. The thin film transistor of claim 1, wherein the thermally cured product is obtained at a curing temperature of less than about 300° C.

10. The thin film transistor of claim 1, wherein the thin film semiconductor comprises an organic semiconducting molecule or polymer.

11. The thin film transistor of claim 1, wherein the thin film semiconductor comprises an inorganic oxide semiconductor.

12. The thin film transistor of claim 1, wherein the gate electrode is deposited on a flexible substrate.

13. The thin film transistor of claim 1, wherein the dielectric layer has a film thickness between about 10 nm and about 50 nm, and exhibits a capacitance per unit area of at least about 90 nF cm$^{-2}$.

14. The thin film transistor of claim 1, wherein the dielectric layer has a dielectric constant of about 4.0 or higher.

15. The thin film transistor of claim 1, wherein the thin film transistor exhibits a mobility of at least about 0.1 cm$^2$/Vs and a current on/off ratio of at least about 10$^3$ at an operating voltage of about ±10 V or lower.

16. The thin film transistor of claim 1, wherein the organosilane crosslinker is a bis(silyl)alkane comprising 4 to 10 carbon atoms.

17. The thin film transistor of claim 16, wherein each silyl group of the bis(silyl)alkane is functionalized with at least one alkoxy group.

18. A thin film transistor comprising:
   a thin film semiconductor;
   source and drain electrodes in contact with the thin film semiconductor;
   a dielectric layer adjacent the thin film semiconductor, wherein the dielectric layer comprises a thermally cured product of a blend composition comprising a zirconium oxide precursor sol and a bis(silyl)alkane; and
   a gate electrode in contact with the dielectric layer;
   wherein the zirconium oxide precursor sol comprises one or more zirconium oxide precursors selected from the group consisting of ZrCl$_4$, ZrOCl$_2$, and Zr(OR)$_4$, wherein each R independently is a C$_{1-6}$ alkyl group, and wherein the one or more zirconium oxide precursors are present in the blend composition at a molar concentration in excess of the bis(silyl)alkane.

19. The thin film transistor of claim 18, wherein the one or more zirconium oxide precursors are present in the blend composition at a molar concentration between about 2 times and about 10 times of the molar concentration of the bis(silyl)alkane.

20. The thin film transistor of claim 18, wherein each silyl group of the bis(silyl)alkane is functionalized with at least one alkoxy group.

* * * * *